United States Patent
Torrisi et al.

(10) Patent No.: US 6,909,626 B2
(45) Date of Patent: Jun. 21, 2005

(54) METHOD AND RELATED CIRCUIT FOR ACCESSING LOCATIONS OF A FERROELECTRIC MEMORY

(75) Inventors: Salvatore Torrisi, Catania (IT); Giampiero Sberno, Catania (IT); Nicolas Demange, Lessy (FR)

(73) Assignee: STMicroelectronics S.r.l., Agrate Brianza (IT)

( * ) Notice: Subject to any disclaimer, the term of this patent is extended or adjusted under 35 U.S.C. 154(b) by 120 days.

(21) Appl. No.: 10/402,853

(22) Filed: Mar. 28, 2003

(65) Prior Publication Data

US 2004/0015643 A1 Jan. 22, 2004

(30) Foreign Application Priority Data

Mar. 29, 2002 (IT) ...................................... MI2002A0673

(51) Int. Cl.[7] .............................................. G11C 11/22
(52) U.S. Cl. .................... 365/145; 365/149; 365/189.09
(58) Field of Search ................................ 365/145, 149, 365/189.09, 205, 207, 202

(56) References Cited

U.S. PATENT DOCUMENTS

| | | | | |
|---|---|---|---|---|
| 5,539,279 A | * | 7/1996 | Takeuchi et al. ............ | 365/145 |
| 5,671,174 A | * | 9/1997 | Koike et al. ................. | 365/145 |
| 5,940,316 A | * | 8/1999 | Koike ........................... | 365/145 |
| 6,147,895 A | * | 11/2000 | Kamp .......................... | 365/145 |
| 6,795,330 B2 | * | 9/2004 | Demange et al. ........... | 365/145 |
| 2003/0234413 A1 | * | 12/2003 | Sberno et al. ............... | 257/295 |

* cited by examiner

Primary Examiner—Richard Elms
Assistant Examiner—Hien Nguyen
(74) Attorney, Agent, or Firm—Lisa K. Jorgenson; Bryan A. Santarelli; Graybeal Jackson Haley LLP

(57) ABSTRACT

A method and circuit for accessing a memory location comprising at least one respective ferroelectric storage unit of a matrix of ferroelectric storage units, the memory location is selected by connecting a first terminal of a ferroelectric storage element of the at least one respective storage unit to a respective access line to the memory location; at least another memory location to which is not intended to be accessed is also selected. A second terminal of the ferroelectric storage element is biased to a prescribed access electric potential, and an electric potential on the access line is sensed; the second terminal of the ferroelectric storage elements of the other memory location is also biased to the access potential.

20 Claims, 3 Drawing Sheets

METHOD AND RELATED CIRCUIT FOR ACCESSING LOCATIONS OF A FERROELECTRIC MEMORY

PRIORITY CLAIM

This application claims priority from Italian patent application No. MI2002A000673, filed Mar. 29, 2002, which is incorporated herein by reference.

TECHNICAL FIELD

The present invention relates generally to the field of semiconductor memory devices, and particularly to ferroelectric, non-volatile memories. More specifically, the invention concerns a method, and a related circuit, for accessing the locations of a ferroelectric memory.

BACKGROUND

Ferroelectric, non-volatile memories have memory cells consisting of a select, or access, transistor, and a storage capacitor whose dielectric is formed by a film of ferroelectric material. The select transistor and the storage capacitor are connected in series.

By applying an electric field of sufficient intensity to the storage capacitor, the ferroelectric material is polarized in the direction of the electric field, and the resulting polarization is maintained also after the removal of the electric field. If, subsequently, an electric field of sufficient intensity and direction opposite to the polarization direction is applied, the ferroelectric material becomes and remains polarized in such opposed direction also after the removal of the electric field. The polarization of the ferroelectric material has the effect of producing a non-zero electric charge for unit area in the storage capacitor, charge that persists also when no voltage is applied to the capacitor, and that does not disappear in time.

A binary information (bit) can thus be stored in the memory cell, by associating the two logic states "1" and "0" to the two opposite polarization directions of the ferroelectric material storage capacitor.

Ferroelectric memories are also called ferroelectric RAMs or FeRAMs, due to the similarity of their memory cells with those of a dynamic RAM memory (DRAM).

Two families of FeRAMs are known, differing from each other in the number of memory cells employed for storing a single bit.

The FeRAMs belonging to a first family use a single memory cell as a bit storage unit, and for this reason they are also called "1T1C" (one transistor, one capacitor). Thanks to the simplicity of the bit storage unit, these memories can have very large size, of the order of the megabits.

A second family of FeRAMs uses two memory cells as a bit storage unit; for this reason, the FeRAMs of this second family are called "2T2C" (two transistors, two capacitors).

As in other memory devices, also in the FeRAMs the memory cells are arranged by rows and columns to form a matrix. For instance, considering the 1T1C FeRAMs, each memory cell has the gate of the respective select transistor connected to a word line of the matrix, the drain of the select transistor connected to a bit line of the matrix, and the free plate of the respective storage capacitor connected to a plate biasing line of the matrix.

According to a convenient arrangement of the matrix, the memory cells belonging to a same matrix row share the same word line and the same plate line; the memory cells belonging to a same matrix column share the same bit line.

A memory location is formed by a group of memory cells, for instance four, eight, sixteen or more, depending on the degree of parallelism of the memory. Typically, the memory cells forming a given location belong to the same row of the matrix.

Each row of the matrix includes several memory locations; the choice of the number of locations on the single row, and, therefore, the choice of the row length, depends on the requirements for the memory in terms of access time, area and current consumption.

To limit such problems, the prior art limits the number of memory locations belonging to a same row of the matrix. However, this is not particularly desirable, because it imposes limitations on the dimensions of matrices.

Similar problems are also encountered in the 2T2C FeRAMs.

SUMMARY OF THE INVENTION

In view of the state of the art described, an embodiment of the present invention provides a method of accessing the memory locations of a ferroelectric memory that does not pose the aforementioned problems.

In particular, an embodiment of the present invention provides an access method that limits the fatigue, and the consequent deterioration, of the memory cells and the overall current consumption of the memory.

In summary, a method according to an embodiment of the present invention provides for placing the access lines associated with the storage units of the memory locations not intended to be accessed to an electric potential substantially equal to the access electric potential applied to the second terminal of the respective ferroelectric storage element, so as not to modify the polarization state thereof.

Another embodiment of the present invention is a circuit adapted to implement the access method delineated above.

Briefly, a circuit according to an embodiment of the present invention includes selective connection means for selectively connecting the storage units access lines to sensing means for sensing the electric potential; the selective connection means connect to the sensing means the access lines associated with the storage units of the accessed memory location; the selective connection means apply instead to the access lines associated with the storage units of the other, not accessed memory locations an electric potential substantially equal to the access electric potential applied to the second terminal of the respective ferroelectric storage element.

When a memory location is accessed for reading the datum contained therein, the respective word line and plate line are brought to suitable electric potentials; in this way, the select transistors of the memory cells of the location to be read are activated, the storage capacitors are connected to the respective bit line and the free plates of the storage capacitors can be driven as desired, so that electric potentials depending on the state of the memory are established on the bit lines.

Since all the cells of the row share both the word line and the plate line, not only the desired memory location, but all the memory locations of the row are actually accessed in reading. The selection of the location whose content is to be read takes place downstream the reading circuits (sense amplifiers), connecting to the data bus internal to the memory only the outputs of those sense amplifiers that are associated with the desired location.

This memory access scheme has some problems.

It is necessary to keep in mind that reading a FeRAM memory cell is an operation destructive of the datum stored in the cell, that causes the change in the polarization state of the storage capacitors of the cells. Subsequently to the reading, it is therefore necessary to perform a restore operation of the initial datum. This operation, performed by the sense amplifiers, involves a consumption of current.

It can thus be appreciated that a problem of the above-mentioned access scheme is the high current consumption of the memory, since reading a location actually translates into accessing in reading all the memory locations belonging to the same row. Not only the cells of the location of interest, but all the cells of the same row shall be submitted to the restore phase.

Additionally, the memory cells are submitted to an unnecessary and harmful fatigue, deriving from the continuous change of the polarization state of the storage capacitors also when not strictly necessary. The consequence is a worsening of the characteristics of the cells, and a shortening of their operating life.

Thanks to a method according to an embodiment of the present invention, and to a related circuit, it is possible to access a location of a FeRAM memory greatly limiting the fatigue of the memory cells belonging to the memory locations not accessed. The current consumption of the memory is also substantially reduced, because it is no longer necessary to submit the memory cells of the locations not accessed to the data restore function.

BRIEF DESCRIPTION OF THE DRAWINGS

Features and advantages of the present invention will be made evident by the following detailed description of an embodiment thereof, provided merely by way of non-limitative example, that will be made in connection with the attached drawings, wherein.

DETAILED DESCRIPTION

Figure 1:
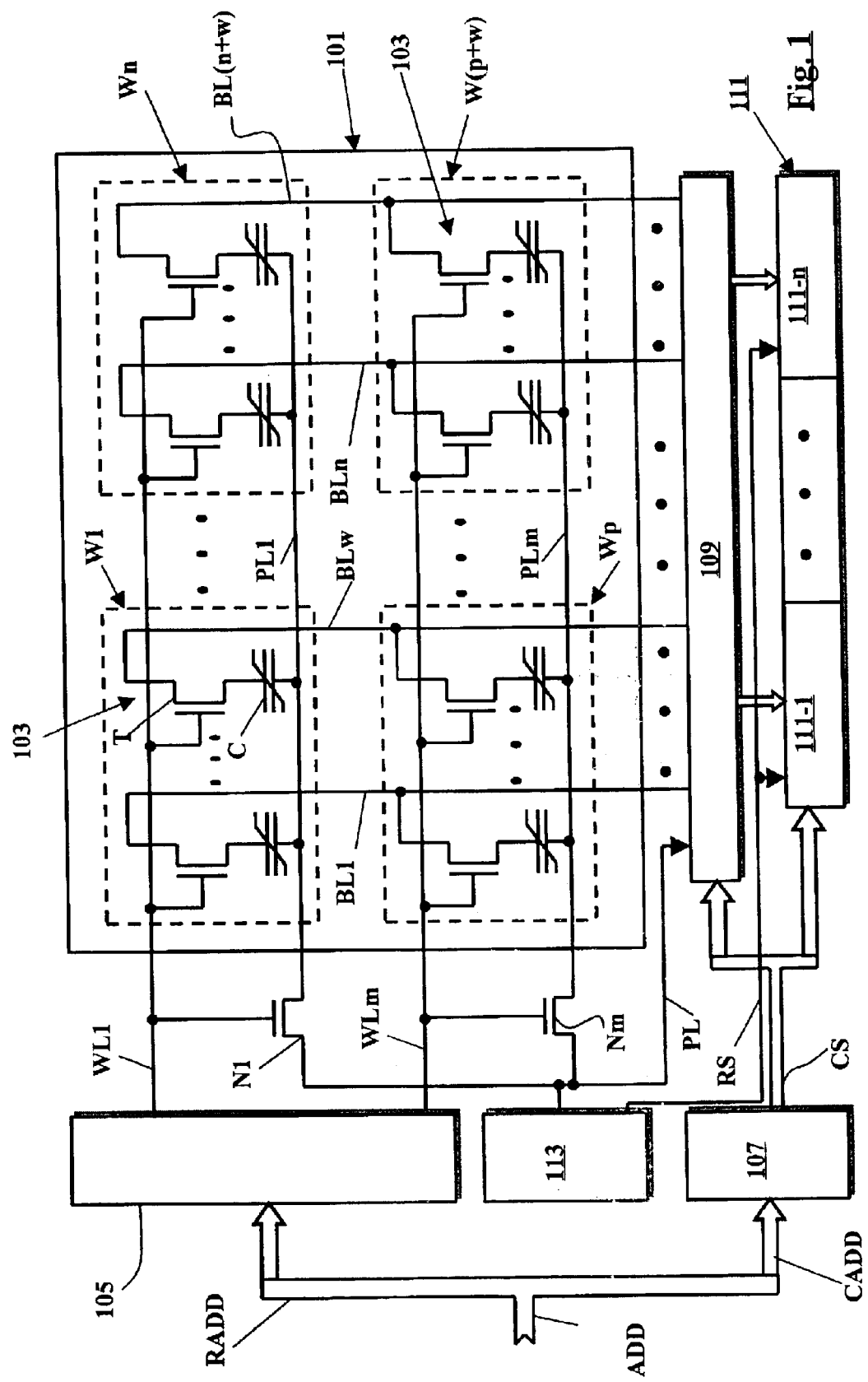
FIG. 1 is a schematic diagram of a ferroelectric memory, particularly a 1T1C FeRAM, to which an access circuit according to an embodiment of the present invention is applied.

Making reference to FIG. 1, an embodiment of a ferroelectric memory is schematically shown. In particular, the memory includes a matrix 101 of storage units 103, each one adapted to store an information binary unit (bit).

The storage units 103 are arranged in a plurality of rows and a plurality of columns. Each storage unit 103 is connected to a respective word line of a plurality of word lines WL1–WLm of the matrix 101; all the storage units 103 connected to a same word line form a row of the matrix 101. In FIG. 1, only two word lines WL1 and WLm, and thus only two rows, are shown for simplicity, respectively, the first and the last of the matrix 101. Each storage unit 103 is additionally connected to a respective bit line of a plurality of bit lines BL1–BL(n+w) of the matrix 101; the storage units 103 connected to a same bit line form a column of the matrix 101. In FIG. 1, only four bit lines BL1, BLw, BLn and BL(n+w), and thus only four columns, are shown for simplicity.

Groups of storage unit 103 belonging to a same row of the matrix 101 form memory locations. Each row of the matrix 101 allocates a plurality of memory locations. In FIG. 1, only four memory locations W1, Wn, Wp and W(p+w) are shown for simplicity, two memory locations belonging to the first row and two memory locations belonging to the last row of the matrix 101.

As mentioned in the foregoing, the example shown in FIG. 1 relates to a 1T1C FeRAM. Each storage unit 103 is thus formed by a select, or access, transistor T and a storage capacitor C. The storage capacitor C has a capacitor dielectric formed of a ferroelectric material. The select transistor T is, for instance, an N-channel MOSFET having a drain connected to the respective bit line BL1–BL(n+w), a source connected to a first plate of the respective storage capacitor C, and a gate connected to the respective word line WL1–WLm.

A second plate of the storage capacitors C of all the storage units 103 belonging to the same row are connected to a respective plate biasing line (plate line) PL1–PLm. Through the plate line PL1–PLm, the suitable potential for biasing the second plate of the storage capacitors C is carried into the matrix 101.

All the plate lines PL1–PLm are connected, through respective selective connection elements such as N-channel MOSFETs N1–Nm, to a plate biasing line PL common to the whole matrix 101. The electric potential of the plate biasing line PL is determined by a plate voltage generator circuit, schematically represented by a block 113. In particular, the plate voltage generator 113 manages the correct polarization of the second plates of the storage capacitors C during the read operation of the content of a memory location, including the phase of restore of the information that is stored in a storage unit previously to the read access.

The selection of the rows of the matrix 101 is entrusted to a row address decoder and word line selector circuit 105. The row address decoder and word line selector circuit 105 receives a set of row address signal lines RADD, part of a bus ADD of address signal lines. The bus of address signal lines ADD carries a binary code forming an address, for instance, provided to the memory by external devices such as a microprocessor or a memory controller, for the selection of a location of the memory. Depending on the row address received, the circuit 105 univocally selects one of the word lines WL1–WLm, bringing the potential thereof to a prescribed value, for instance 5 V, adapted to turn on the select transistors T of the storage units 103 of the corresponding row; all the remaining word lines are left to a potential (for instance, 0 V) such that the select transistors T of the respective storage units 103 are off.

Each word line WL1–WLm also controls the selective connection element for the selective connection of the associated plate line PL1–PLm to the plate biasing line PL, i.e., in the shown example, the transistor N1–Nm.

A column address decoder circuit 107 receives from the bus of address signal lines ADD a group of column address signal lines CADD.

Depending on the binary code carried by the group of column address signal lines CADD, the column address decoder circuit 107 controls the electric potential of column selection signal lines CS. The column selection signal lines CS are fed to a column multiplexing circuit 109 and to a group 111 of read circuits (sense amplifiers), comprising as many sense amplifiers as the bit lines BL1–BL(n+w) of the matrix 101.

As it will be explained hereinafter, the column multiplexing circuit 109 allows selecting one among the n memory locations W1–Wn, . . . , Wp–W(p+w) that belong to a given row of the matrix 101, connecting the respective bit lines BL1–BLw, . . . , BLn–BL(n+w) to a respective array of sense amplifiers 111_1–111_n of the group of read circuits 111. The column selection signals CS allow selectively connecting one of the arrays 111_1–111_n of sense amplifiers to a bus of data lines DQ of the memory.

Figure 2:
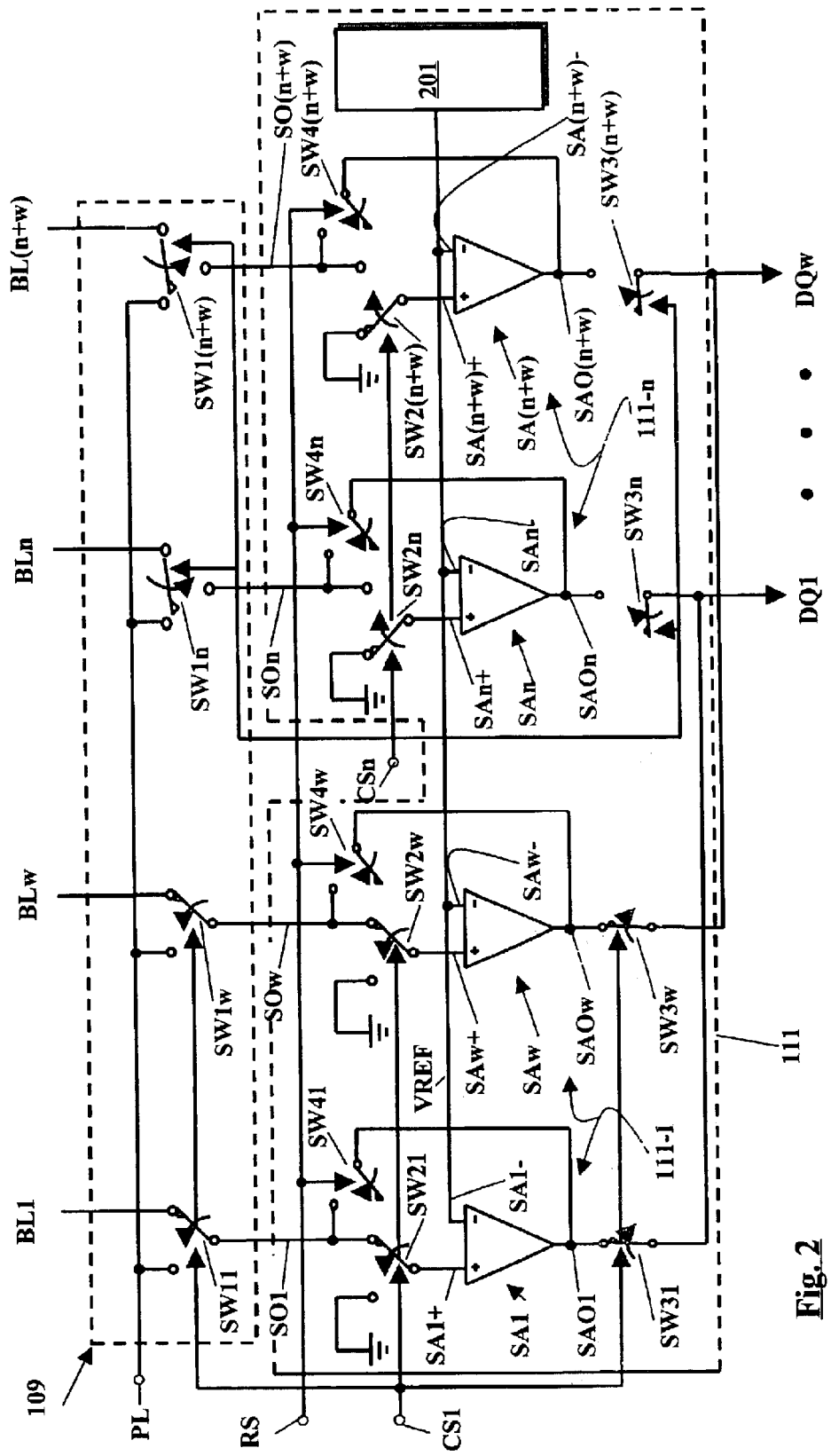
FIG. 2 shows, still schematically but in greater detail, two circuit blocks of the memory FIG. 1 according to an embodiment of the invention.

FIG. 2 shows, still schematically but in greater detail compared to FIG. 1. an embodiment of the column multiplexing circuit 109 and the read circuits 111.

The column multiplexing circuit 109 includes a plurality of switches SW11–SW1(n+w), one for each bit line BL1–BL(n+w) of the matrix 101. Each switch SW11–SW1(n+w) allows selectively connecting an output line SO1–SO(n+w) thereof to the corresponding bit line BL1–BL(n+w) or to the plate biasing line PL. The plurality of switches SW11–SW1(n+w) is divided into arrays of switches SW11–SW1w, . . . , SW1n–SW1(n+w). Each array of switches SW11–SW1w, . . . , SW1n–SW1(n+w) is associated with a respective group of bit lines BL1–BLw , . . . , BLn–BL(n+w) connected to the storage units 103 that, in each row of the matrix 101, form a given memory location W1–Wp, . . . , Wn–W(p+w). The switches SW11–SW1(n+w) belonging to a given array of switches SW11–SW1w, . . . , SW1n–SW1(n+w) are controlled by a same column selection signal line CS1–CSn, part of the column selection signal lines CS. The switches SW11–SW1(n+w) can be formed by conventional techniques adopted in integrated circuits, particularly by means of MOSFETs, for instance, N-channel MOSFETs, having a drain connected to the respective bit line, a source connected to the respective output line and a gate connected to the respective column selection signal line.

The group of sense amplifiers 111 includes a sense amplifier SA1–SA(n+w) for each bit line BL1–BL(n+w) of the matrix 101. In the drawing, each sense amplifier SA1–SA(n+w) has been schematized by a voltage comparator with a non-inverting input line SA1+–SA(n+w)+ and an inverting input line SA1––SA(n+w)–. The non-inverting input line SA1+–SA(n+w)+ of a given sense amplifier SA1–SA(n+w) can be selectively connected, through a respective switch SW21–SW2(n+w), to the output line SO1–SO(n+w) of a respective switch SW11–SW1(n+w) of the multiplexing circuit 109, or to a prescribed potential, for instance, the ground (0 V). The inverting input line SA1––SA(n+w)– of a given sense amplifier SA1–SA(n+w) is connected to a reference potential line VREF, generated by a reference voltage generator 201. For each array of sense amplifiers 111_1–111_n, the respective switches SW21–SW2w, . . . , SW2n–SW2(n+w) are controlled by a same column selection signal line CS1–CS(n+w).

The reference voltage VREF can be, for instance, generated by means of memory cells similar to those of the matrix 101, in a determined polarization state, that instead of being employed for the storage of information, behave as reference cells. The reference cells can be located on a dedicated row of the matrix; in such case, the reference voltage VREF is not unique for all the sense amplifiers, as in the simple example shown, on the contrary each sense amplifier has its own reference voltage. Any one of the known different reference voltage generation schemes can be used.

Each sense amplifier SA1–SA(n+w) has an output line SAO1–SAO(n+w) that can be selectively connected/disconnected, through a respective switch SW31–SW3(n+w), to/from a line DQ1–DQw of the bus of data lines DQ. In each array of sense amplifiers 111_1–111_n, a one-to-one relationship exists between the sense amplifiers and the lines of the data bus.

As mentioned above, reading a ferroelectric memory cell destroys the information contained therein. For restoring the information in the read storage unit 103, the output line SAO1–SAO(n+w) of each sense amplifier SA1–SA(n+w) can be selectively connected to the respective bit line BL1–BL(n+w): in this way, the information read from the storage unit and present at the output of the sense amplifier can be reinstated, in terms of suitable electric potential, onto the bit line to which the storage unit belongs. As schematically shown in FIG. 2, this can, for instance, be achieved through a switch SW41–SW4(n+w) that, under the control of a restore signal RS, e.g. controlled by of the plate voltage generator 113, makes it possible to connect the output line SAO1–SAO(n+w) of the respective sense amplifier SA1–SA(n+w) (for instance, equipped with a bistable final stage capable of latching the result of the reading) to the output line SO1–SO(n+w) of the switch SW11–SW1(n+w), and, thus, to the bit line BL1–BL(n+w).

It is pointed out that although in the shown example the storage units forming a generic memory location are adjacent to each other along the respective word line, this is not to be intended as a limitation. Through a simple rearrangement of the multiplexing circuit 109 and of the sense amplifiers, the storage units forming a memory location can be arranged in any order along a word line.

Figure 3:
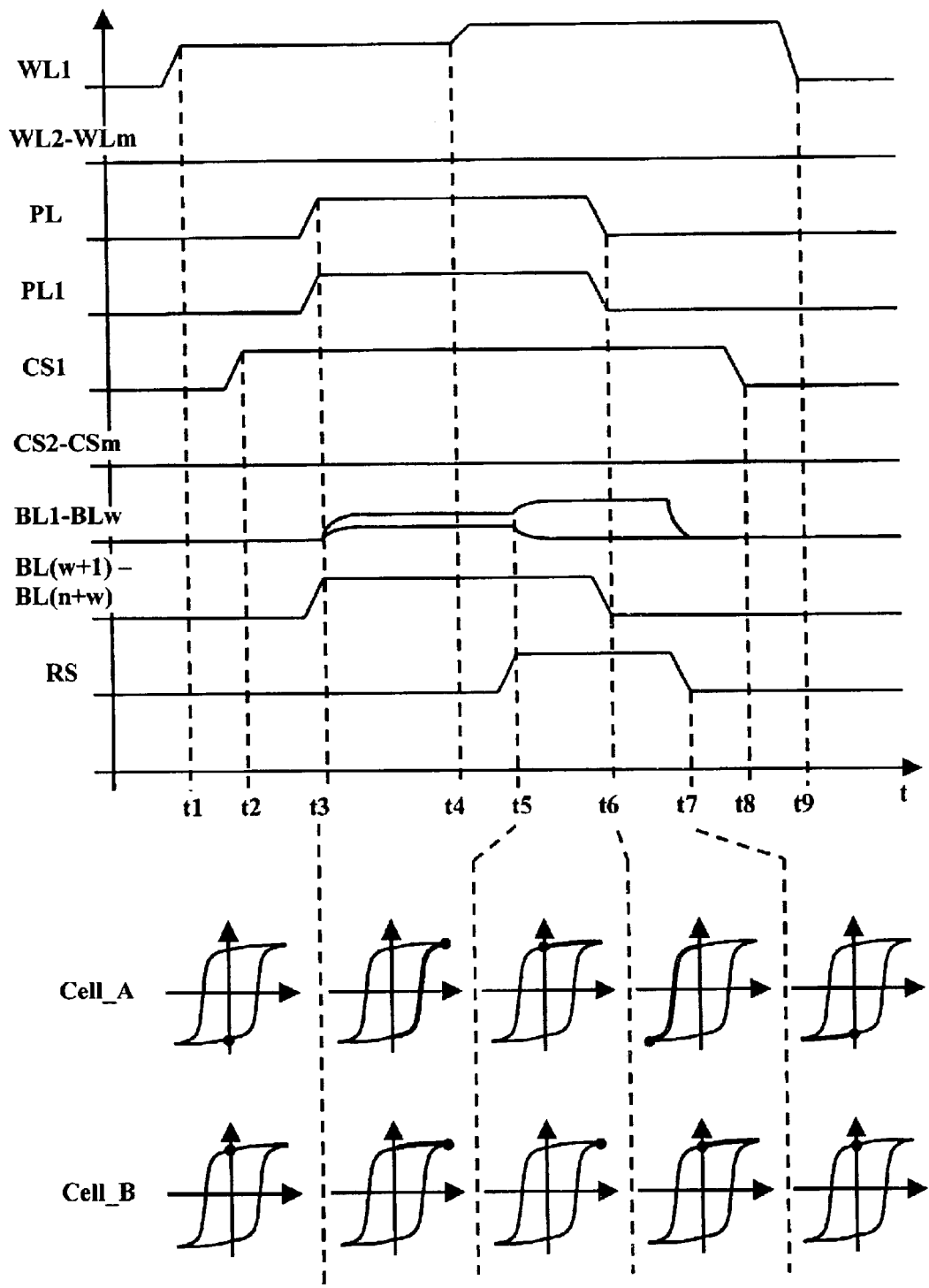
FIG. 3 is a time diagram showing the evolution in time of the main signals in the memory, during a read operation according to an embodiment of the invention.

The operation of the memory will be now described making reference to the time diagram of FIG. 3. FIG. 3 also shows, for the different phases of a read operation, the evolution of the polarization state of two storage units initially in opposite polarization states. Particularly, the upper row (Cell_A) relates to a storage unit that, during the reading, is subject to an inversion of the initial polarization state; the lower row (Cell_B) relates, instead, to a storage unit that does not change polarization state during the reading. The polarization state is represented by a dot that moves on a hysteresis loop of the ferroelectric material in a Cartesian plane, with in abscissa the difference of electric potential seen by the storage capacitor (potential on the plate connected to the bit line minus potential on the plate connected to the plate line), and, in ordinate, the electric charge on the capacitor plates.

By way of example only, it will be assumed that it is intended to access the memory location W1, so as to read the content thereof. The address provided to the memory will, thus, cause the selection of the word line WL1, whose electric potential will be brought by the circuit 105, at the instant t1, to a prescribed value (typically, the supply voltage VDD of the memory, for instance, 5 V), adapted to turn on the select transistors T of the storage units 103 that belong to the word line WL1; all the remaining word lines of the matrix 101 are brought to an electric potential (for instance, the ground) inhibiting the turning on of the select transistors T of the respective storage units. The storage capacitors C of all the storage units 103 of the word line WL1 are connected to the respective bit lines BL1–BL(n+w). The selection of the word line WL1 also causes the MOSFET N1 to be turned on, thus connecting the plate line PL1 to the plate biasing line PL; the remaining plate lines are instead left disconnected from the line PL.

Subsequent to the selection of the word line WL1, at the instant t2, the circuit 107 asserts the column selection signal CS1. This causes the switches SW11–SW1w of the column multiplexing circuit 109 to be turned onto the respective bit lines BL1–BLw, the switches SW21–SW2w to be turned onto the respective output lines SO1–SOw of the switches SW11–SW1w, and the switches SW31–SW3w to connect the output lines SAO1–SA0w of the sense amplifiers SA1–SAw to the data lines DQ1–DQw. All the remaining column selection signals CS2–CSn are deasserted; the respective switches of the column multiplexing circuit 109 (as for instance, the switches SW1n–SW1(n+w) shown in FIG. 2) are positioned so as to connect the respective bit lines to the plate biasing line PL; the respective switches associated with to the non-inverting inputs of the sense amplifiers (as for instance the switches SW2n–SW2(n+w) shown in FIG. 2) disconnect such inputs from the output lines of the respective switches of the column multiplexing circuit 109, setting them to ground; the switches on the output lines of the sense amplifiers (as for instance the switches SW3n–SW3(n+w)) disconnect such output lines from the data lines DQ1–DQw.

At the instant t3, the circuit 113 asserts the plate biasing line PL, bringing it from an initially low electric potential, for instance equal to the ground, to a prescribed access electric potential to the storage units, higher than the initial potential and for instance equal to the memory supply voltage VDD. In this way, the plate line PL1, and thus, the plates of the storage capacitors C of the storage unit 103 of the word line WL1, are brought to the access electric potential.

The reading of the storage units 103 that belong to the selected memory location W1 takes place in the conventional way; by partition of the charge of the storage capacitors C on parasitic capacitors (not shown) that are associated with the respective bit lines BL1–BLw. The potential of the bit lines evolves in a way that depends on the polarization state of the storage capacitors. During the reading, the storage capacitors that are in a given one of the two polarization states change their polarization state.

In those storage units 103 that, even if belonging to the selected word line WL1, belong to the other memory locations (e.g., the memory location Wn shown in FIG. 1), the storage capacitors C will instead be applied a voltage difference substantially equal to zero, being the respective bit lines connected to the plate biasing line PL; in this way, the polarization state of all these storage capacitors will remain unchanged.

At the instant t4, the potential of the selected word line WL1 is raised further, so as to allow the select transistors T of the storage units 103 to transfer onto the plates of the respective storage capacitors C the relatively high potential that will be applied to the bit lines during the phase of restore of the information in the storage units 103 whose storage capacitors C have changed polarization state.

Beginning from the instant t2, the sense amplifiers SA1–SAw sense the electric potential that develops on the bit lines associate therewith, comparing it with the reference voltage VREF. An electric potential provided on the output lines SAO1–SAOw corresponds to the performed reading, particularly a potential equal to the memory supply voltage VDD or equal to the ground. The result of the reading is made available on the data lines DQ1–DQw.

At the instant t5, the phase of restore of the initial polarization conditions of the accessed storage capacitors C is started. The restore signal RS is asserted, and the switches SW41–SW4w are closed, so that the bit lines BL1–BLw are connected to the output lines SAO1–SAOw of the respective sense amplifiers SA1–SAw. At the instant t6, the plate biasing line PL, and thus the plate line PL1, are brought to the ground. In this way, the storage capacitors C that, in the preceding phases, changed polarization state are applied a potential difference equal to the memory supply voltage VDD, and thus an electric field adapted to cause the polarization state to return to the initial state.

Once the restore phase is terminated at the instant t7, the restore signal RS is deasserted and the switches SW41–SW4w are opened again, disconnecting the bit lines BL1–BLw from the output lines SAO1–SAOw of the sense amplifiers SA1–SAw.

Finally, at instant t8, the column selection signal CS1 is deasserted, and, at instant t9, the word line WL1 is deselected.

As it can be appreciated from the foregoing, only those bit lines that lead to the accessed memory location are connected to the respective sense amplifiers; the bit lines that lead to non-accessed memory locations are instead disconnected from the respective sense amplifiers, and the electric potential applied thereto is substantially equal to the electric potential applied to the plate line. The storage capacitors of the storage units that, even if belonging to the selected word line, belong to the non-accessed memory locations are thus applied a substantially zero potential difference, that does not cause any inversion of the polarization state. The restore operation will thus involve only the few storage units of the accessed memory location, and not also all the remaining storage units of the same word line. This translates first of all into a significant reduction in the current consumption of the memory, and, more important, limits the fatigue of the storage units, particularly the fatigue of the storage capacitors. The operating life of the memory is in this way prolonged.

Consequently, the provision of long word lines containing many memory locations does not constitute a problem anymore. It is, thus, possible to realize matrices of large dimensions.

It is observed that although in the described example as many sense amplifiers were provided as the bit lines of the matrix, an alternative embodiment of the invention can provide a single array of sense amplifiers comprising a number of sense amplifiers equal to the number of the bit lines forming a memory location. To such purpose, the multiplexing circuit 109 should allow the connection to the array of sense amplifiers of bit lines leading to the accessed memory location, connecting instead the remaining bit lines to the plate biasing line PL. This allows a significant reduction of area and consumption.

Although the above embodiment of the invention has been herein described in terms of a 1T1C FeRAM, this is not to be construed limitatively. The concept can be straightforwardly applied also in 2T2C FeRAMs, in which it is not necessary to generate a reference voltage for the reading of the storage units. This concept may also be used in other types of memories such as DRAMs.

Furthermore, a ferroelectric memory, such as that shown in FIG. 1, can be included in an electronic system, such as a computer system, and be coupled to a processor or other circuit. In addition, the ferroelectric memory may be embedded in a processor or other circuit.

The embodiment described herein is susceptible of several modifications, and it is possible to devise several other embodiments, without departing from the spirit and scope of the invention.

What is claimed is:

1. A method of accessing a memory location comprising at least one respective ferroelectric storage unit of a matrix of ferroelectric storage units, the method comprising:

selecting the memory location, said selecting comprising connecting a first terminal of a ferroelectric storage element of the at least one respective storage unit of the accessed memory location to a respective access line to the memory location, said selecting also causing the selection of at least another memory location to which is not intended to be accessed;

biasing a second terminal of the ferroelectric storage element of the at least one storage unit of the accessed memory location to a prescribed access electric potential, said biasing also causing the biasing to the access electric potential of the second terminal of the ferroelectric storage elements of the other memory location;

sensing an electric potential on the access lines, characterized by comprising placing onto the access line associated with the at least one storage unit of the other memory location an electric potential substantially equal to the access potential applied to the second terminal of the respective ferroelectric storage element, thereby a polarization state of the ferroelectric storage elements of the other memory location is not modified.

2. The method according to claim 1, in which said sensing an electric potential on the access line includes connecting the access line to a respective read circuit.

3. The method according to claim 2, in which said placing onto the access line associated with the at least one storage unit of the other memory location an electric potential substantially equal to the access potential applied to the second terminal of the respective ferroelectric storage element includes disconnecting the access line associated with the at least one storage unit of said other memory location from a respective read circuit and connecting the access line to a biasing line of the second terminal of the ferroelectric storage elements.

4. The method according to claim 1, further comprising restoring an initial polarization state of the ferroelectric storage element of the at least one storage unit of the selected memory location.

5. An access circuit for accessing a memory location comprising at least one respective ferroelectric storage unit of a matrix of ferroelectric storage units, the access circuit comprising:

means for selecting the memory location, adapted to connect a first terminal of a ferroelectric storage element of the at least one respective storage unit of the accessed memory location to a respective access line to the memory location, the memory location selection means also causing the selection of at least another memory location not intended to be access;

means for biasing a second terminal of the ferroelectric storage element of the at least one storage unit of the accessed memory location to a prescribed access electric potential, the biasing means also causing the biasing to the access electric potential of the second terminal of the ferroelectric storage elements of the other memory location;

means for sensing an electric potential on the access lines, characterized by comprising means for the selective connection of the access lines to the electric potential sensing means, said selective connection means connecting to the sensing means the access line associated with the at least one storage unit of the accessed memory location and applying to the access lines associated with the storage units of the other memory locations an electric potential substantially equal to the access electric potential applied to the second terminal of the respective ferroelectric storage element.

6. The circuit according to claim 5, in which the selective connection means are adapted to connect the access lines associated with the storage units of the other memory locations to a biasing line of the second terminal of the ferroelectric storage elements.

7. The circuit according to claim 6, in which said sensing means include a read circuit for each access line.

8. The circuit according to claim 6, in which the sensing means include a number of read circuits equal to the number of storage units of a memory location.

9. A ferroelectric memory comprising:

an arrangement of storage units comprising at least one row of storage units, the storage units of the at least one row forming at least two memory locations;

means for selecting the at least one row, adapted to connect a first terminal of a ferroelectric storage element of the storage units of the row to a respective access line;

means for biasing a second terminal of the ferroelectric storage element of the storage units of the row to a prescribed access electric potential;

means for sensing an electric potential on the access lines, characterized by comprising means for the selective connection of the access lines to the electric potential sensing means, said selective connection means connecting to the sensing means the access lines associated with the storage units of the accessed memory location, and applying to the access lines associated with to the storage units of the other memory location an electric potential substantially equal to the access electric potential applied to the second terminal of the respective ferroelectric storage element.

10. The memory according to claim 9, in which said sensing means include a read circuit for each access line.

11. The memory according to claim 9, in which the sensing means include a number of read circuits equal to the number of storage units of a memory location.

12. A method, comprising:

reading a first memory location having a first storage capacitor by coupling a first plate of the first storage capacitor to a predetermined voltage and sensing a voltage level on a second late of the first storage capacitor; and coupling the predetermined voltage to both a first plate and a second plates of a second storage capacitor of a second memory location while reading the first memory location.

13. The method of claim 12 wherein reading the first memory location comprises driving an active voltage level onto a word line that is coupled to both the first and second memory locations.

14. The method of claim 12 wherein the first and second storage capacitors comprise respective first and second ferroelectric capacitors.

15. A memory, comprising:

first and second memory locations each including a respective storage element;

a word line coupled to respective first nodes of the first and second memory locations;

first and second bit lines each respectively coupled to a second node of the first and second memory locations;

a plate line coupled to respective third nodes of the first and second memory locations;

a sense amplifier;

a selection circuit operable to drive the word line with a first predetermined voltage during a read of the first memory location; and a multiplexer operable to couple the first bit line to the sense amplifier and the second bit line to the plate line during a read of the first memory location.

16. The memory of claim 15 wherein the multiplexer is operable to couple the first bit line to the plate line and the second bit line to the sense amplifier during a read of the second memory location.

17. The memory of claim 15, further comprising a plate-line voltage coupled to the plate line and operable to:

drive a second predetermined voltage onto the plate line during a read portion of the read of the first memory location; and drive a third predetermined voltage onto the plate line during a restore portion of the read of the first memory location.

18. The memory of claim 15 wherein the storage elements of the first and second memory locations each comprise a respective ferroelectric capacitor.

19. An electronic system, comprising:

a memory including, first and second memory locations each including a respective storage element;

a word line coupled to respective first nodes of the first and second memory locations;

first and second bit lines each respectively coupled to a second node of the first and second memory locations;

a plate line coupled to a respective third node of the first and second memory locations;

a sense amplifier;

a selection circuit operable to drive the word line with a first predetermined voltage during a read of the first memory location; and a multiplexer operable to couple the first bit line to the sense amplifier and the second bit line to the plate line during a read of the first memory location.

20. The system of claim 19, further comprising a processor coupled to the memory.

* * * * *

UNITED STATES PATENT AND TRADEMARK OFFICE
CERTIFICATE OF CORRECTION

PATENT NO. : 6,909,626 B2 Page 1 of 1
DATED : June 21, 2005
INVENTOR(S) : Torrisi et al.

It is certified that error appears in the above-identified patent and that said Letters Patent is hereby corrected as shown below:

<u>Column 10,</u>
Line 51, please replace "late" with -- plate --.
Line 54, please replace "plates" with -- plate --.

Signed and Sealed this

Sixth Day of September, 2005

JON W. DUDAS
*Director of the United States Patent and Trademark Office*